United States Patent [19]

Nishi et al.

[11] Patent Number: 5,611,850

[45] Date of Patent: Mar. 18, 1997

[54] COMPOSITION FOR ANTI-REFLECTIVE COATING ON RESIST

[75] Inventors: Mineo Nishi; Tadashi Teramoto, both of Kitakyushu, Japan

[73] Assignee: Mitsubishi Chemical Corporation, Tokyo, Japan

[21] Appl. No.: 618,307

[22] Filed: Mar. 18, 1996

[30] Foreign Application Priority Data

Mar. 23, 1995 [JP] Japan .................................. 7-064132

[51] Int. Cl.⁶ .......................... C09D 5/32; C09D 201/04; G03L 5/00; G03L 1/73
[52] U.S. Cl. ................. 106/287.26; 106/287.28; 430/273.1; 430/325
[58] Field of Search .................. 106/287.26, 287.28; 430/273.1, 325

[56] References Cited

U.S. PATENT DOCUMENTS

| 4,514,537 | 4/1985 | Cavanaugh | 524/265 |
| 5,330,883 | 7/1994 | Garza | 430/513 |
| 5,514,526 | 5/1996 | Nishi et al. | |

FOREIGN PATENT DOCUMENTS

| 0522990 | 1/1993 | European Pat. Off. | |
| 58-213057 | 10/1983 | Japan | 106/287.28 |
| WO93/24860 | 12/1993 | WIPO | |

*Primary Examiner*—David Brunsman
*Attorney, Agent, or Firm*—Oblon, Spivak, McClelland, Maier & Neustadt, P.C.

[57] ABSTRACT

A composition for an anti-reflective coating on resist, which comprises a water-soluble fluorine compound and water as the main components, wherein the water-soluble fluorine compound contains (A) a water-soluble fluorine compound that is solid at 20° C., 1 atmospheric pressure, and (B) a water-soluble fluorine compound that is liquid at 20° C., 1 atmospheric pressure and that has a boiling point of at least 100° C. under 1 atmospheric pressure.

7 Claims, No Drawings

COMPOSITION FOR ANTI-REFLECTIVE COATING ON RESIST

The present invention relates to a composition for anti-reflective coating on resist used in a fine processing method in the production of semiconductor elements or the like.

Fine processing techniques for preparing integrated circuits or the like have been improved year by year in respect of processing accuracy, and taking dynamic random access memories (DRAM) for instance, processing techniques in the order of submicron have been established at a mass production level up to now.

The processing techniques for submicron photolithography using a light of a short wavelength such as g-ray (436 nm), i-ray (365 nm) and KrF excimer laser (248 nm). A photoresist composition used in these techniques has been more and more improved to provide various photoresist compositions of high performances.

Performances required for these photoresist compositions are not only high resolution but also that dimension variations of transferred minute patterns by thickness of a coating film are minimized. However, in the photolithography, due to influence by light interference, the minimizing of the dimension variations of minute patterns by the thickness of a coating film is limited.

That is, an irradiated light repeats multiple reflections within a photoresist coating film between the upper surface and the lower surface of the film, and since the irradiated light is a monochromatic light, an effective light amount varies depending on the coating film thickness by interference with a reflected light, thus the improvement of dimension accuracy being limited.

As a method for solving this problem, there has been proposed a method of improving the dimension accuracy (dimension control) by forming a transparent film which has a refractive index different from that of a photoresist coating film on the photoresist coating film so as to minimize multiple reflections within the film by employing phase interference between (i) a light reflecting from the upper surface of the photoresist coating film and (ii) a light passing through the upper surface of the photoresist coating film and reflecting from the upper surface of the newly coated transparent film of different refractive index (see Japanese Unexamined Patent Publication No. 149130/1985, Japanese Unexamined Patent Publication No. 62520/1987, Japanese Unexamined Patent Publication No. 62521/1987 and Japanese Unexamined Patent Publication No. 188598/1993).

The most satisfactory refractive index of the above-mentioned transparent film is the square root of the refractive index of the photoresist coating film, and generally ranges from 1.25 to 1.35. However, in a preferred embodiment of lithography step, it is required to form and remove a coating film in a water medium, and under this requirement, the lowest possible refractive index is about 1.4 at present.

Thus, it is generally preferable to employ a fluorine-containing compound in order to lower a refractive index, but there are few water-soluble fluorine-containing compounds having a film-formability. Therefore, a film-formable polymer containing no fluorine must be added and the addition of this film-formable polymer prevents the refractive index from being lowered.

Also, conventional compositions for anti-reflective coating on resist provide such various disadvantages that a coated film thickness is not uniform (this phenomenon is called as "striation"), that, though a satisfactory film is formed immediately after coating, undesirable particle-like substances are formed within the film in a short time (for example, within 24 hours), that much residue (scum) is formed after development depending on a photoresist used, and that transferred patterns are peeled during developing. These compositions are not practically usable even if they provide a satisfactorily low refractive index.

Under these circumstances, the present invention has been made to provide a composition for an anti-reflective coating on resist that has a low refractive index (at most 1.4), that is capable of satisfactorily forming or removing a coating film in a water medium, and that no problem of development residue (scum) is caused.

In order to solve these problems, the present inventors have studied and discovered that the above-mentioned object can be achieved by preparing a composition for an anti-reflective coating on resist by using a specific compound, without using or with only a very minor amount of a film-formable polymer which makes the lowering of a refractive index difficult.

That is, the essential feature of the present invention resides in a composition for an anti-reflective coating on resist, which comprises a water-soluble fluorine compound and water as the main components, wherein the water-soluble fluorine compound contains (A) a water-soluble fluorine compound that is solid at 20° C., 1 atmospheric pressure, and (B) a water-soluble fluorine compound that is liquid at 20° C., 1 atmospheric pressure and that has a boiling point of at least 100° C. under 1 atmospheric pressure.

Hereinafter, the present invention is further described in more details.

In the present invention, (A) the water-soluble fluorine compound that is solid at 20° C., 1 atmospheric pressure is not specially limited so long as it satisfies the above condition, but is preferably a water-soluble fluorine compound that is solid at 25° C. Also, the water-soluble solid fluorine compound (A) has preferably a boiling point of at least 150° C., more preferably at least 200° C., most preferably at least 250° C. under 1 atmospheric pressure. The term "water-soluble" used in the present invention means that at least 0.1 wt %, preferably at least 0.5 wt %, is dissolved in an aqueous solution. The term "aqueous solution" used herein means a solution comprising mainly water, and also means water alone or a mixture of water with at most 30 wt %, preferably at most 20 wt %, of an organic solvent. Examples of the organic solvent are illustrated hereinafter in the explanation of the solvent used in the composition of the present invention.

The water-soluble solid fluorine compound (A) is a water-soluble compound that is solid at 20° C., such as a perfluoroalkylsulfonic acid or a perfluoroalkylcarboxylic acid having a total carbon number of from 3 to 30, preferably from 5 to 20; a perfluoroalkylbenzenesulfonic acid, a perfluoroalkyloxybenzenesulfonic acid, a perfluoroalkylbenzenecarboxylic acid or a perfluoroalkyloxybenzenecarboxylic acid having a total carbon number of from 8 to 40, preferably from 9 to 20; and a perfluoroalkylpolyether sulfonic acid or a perfluoroalkylpolyether carboxylic acid having a total carbon number of from 4 to 1,000, preferably from 4 to 500. Each of the above-mentioned fluorine-containing organic compounds (A) may be in the form a free acid, an ammonium salt or a mono- to tetra alkylammonium salt which may be substituted with fluorine. Also, these water-soluble solid fluorine compounds (A) may be used in a mixture of two or more.

Among them, preferable examples include at least a member selected from the group consisting of a perfluoroalkylsulfonic acid, a perfluoroalkylcarboxylic acid, a perfluoroalkylpolyethersulfonic acid, a perfluoroalkylpolyethercarboxylic acid and their salts.

More particular examples of the above-mentioned fluorine-containing organic compounds are perfluorobutanesulfonic acid, perfluoroheptanesulfonic acid, perfluorooctanesulfonic acid, perfluorodecanesulfonic acid, perfluoroadipic acid, perfluorooctanoic acid, perfluoroazelaic acid, perfluorosebacic acid, perfluoro-1,10-decanedicarboxylic acid, perfluoroheptaoxybenzenesulfonic acid, a perfluoroalkylpolyethersulfonic acid (e.g. Nafion® manufactured by DuPont), a perfluoroalkylpolyethercarboxylic acid, a perfluoroalkylpolyetherdicarboxylic acid, and a water-soluble acrylic acid derivative polymer having a fluoroalkyl group that is a solid compound at 20° C., 1 atmospheric pressure.

Also, as the water-soluble solid fluorine compound (A), a compound of the following formula, such as 2,2,3,3,4,4,5,5-octafluorohexane-1,6-diol, can be preferably used.

$HOCH_2(CF_2)_nCH_2OH$ (n=2–4)

On the other hand, (B) the water-soluble fluorine compound that is liquid at 20° C., 1 atmospheric pressure and that has a boiling point of at least 100° C. under 1 atmospheric pressure, is not limited so long as it satisfies the above condition, and is preferably a water-soluble fluorine compound that is liquid at 10° C. Also, the water-soluble liquid fluorine compound (B) has preferably a boiling point of at least 150° C., more preferably at least 200° C. at one atmospheric pressure. Further, if the viscosity of the liquid fluorine compound is too low, a satisfactory film is hardly obtainable, and therefore it has generally a viscosity of at least 3 centipoises (cPs), preferably at least 10 centipoises, more preferably at least 30 centipoises, most preferably at least 50 centipoises, at 25° C. The upper limit of the viscosity of the water-soluble liquid fluorine compound (B) is not substantially limited, and a jelly-like compound is also usable so long as it is soluble in an aqueous solution.

Examples of the water-soluble liquid fluorine compound (B) include the following compounds:

① a neutral water-soluble fluorine compound of the following formula (I):

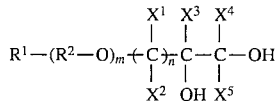

wherein $R^1$ is a fluorine-substituted alkyl group, $R^2$ is an alkylene group which may be substituted with fluorine, $X^1$, $X^2$, $X^3$, $X^4$ and $X^5$ are independently a hydrogen atom or a fluorine atom, and m and n are respectively an integer of from 0 to 5;

② a perfluoroalkylsulfonic acid or a perfluoroalkylcarboxylic acid such as trifluoromethanesulfonic acid and heptafluorobutanoic acid; and ③ a perfluoroalkylpolyethersulfonic acid and a perfluoroalkylpolyethercarboxylic acid, having a total carbon number of from 4 to 1,000, preferably from 4 to 500, such as perfluoro(2-ethoxyethane)sulfonic acid, perfluoro-2,5-dimethyl-3,6-dioxanonanoic acid and perfluoro-2,5,8-trimethyl-3,6,9-trioxadodecanoic acid, that is liquid at 20° C., 1 atmospheric pressure.

Among these water-soluble liquid fluorine compounds (B), a compound of the above formula (I) or a perfluoroalkylpolyethercarboxylic acid, that is liquid at 20° C., 1 atmospheric pressure, is preferable.

Among these examples, the perfluoroalkylpolyethercarboxylic acid has preferably a weight average molecular weight of at most 6,000, preferably from 1,000 to 5,500, more preferably 1,500 to 5,000. If the molecular weight is too small, crystal-like undesired substances are occurred in a coating film. On the other hand, if the molecular weight is too large, the compound becomes hardly soluble in an aqueous solution. More particular examples of the perfluoroalkylpolyethercarboxylic acid include Krytox® 157FSL and Krytox®157FSM manufactured by Du Pont having the following formula (II).

$F-[CF(CF_3)CF_2O]_n-CF(CF_3)_3-COOH$ (II)

(n=an integer of at least 1)

Each of the above fluorine-containing organic compounds may be in the form of a free acid, an ammonium salt, or a mono- to tetraalkylammonium salt which may be substituted with fluorine.

These compounds are preferably neutral, since if an acidic compound is used, an apparatus tends to be corroded thereby.

In the present invention, the term "neutral" means a pH range of from 4 to 10, preferably from 5 to 9, in a 1 wt % aqueous solution. (The term "aqueous" solution used herein means a solution containing at least 50 wt % of water as the main component.)

In the above formula (I), more preferable examples of a fluorine-substituted alkyl group indicated as $R^1$ include a fluorinated alkyl group having a carbon number of from 2 to 20, preferably from 2 to 15, and examples of an alkylene group indicated as $R^2$, include an alkylene group having a carbon number of from 1 to 5 which may be substituted with fluorine. Also, m and n are respectively an integer of from 0 to 5, preferably 1.

Examples of the compound of the above formula (I) include 3-(2-perfluorohexyl)ethoxy-1,2-dihydroxypropane (boiling point: at least 300° C./1 atom, 125° C./0.2 mmHg), and the like. Also, examples of other neutral water-soluble fluorine compounds include fluoroalkyl alcohols, such as 2,2,3,3-tetrafluoropropanol (b.p. 110° C.), 2,2,3,3,4,4-hexafluorobutanol (b.p. about 125° C.) and 2,2,3,3,4,4,5,5-octafluoroethanol (b.p. 140° C.), a polymer comprising a fluorine-containing (meth)acrylic acid derivative (constitution unit) such as an acrylic acid and/or methacrylic acid-fluoroalkyl ester which is liquid at 20° C., 1 atmospheric pressure, e.g. FC-430 manufactured by Sumitomo 3M Co., Ltd. and F-177, F-179 manufactured by Dainippon Ink & Chemicals, Inc., and FC-171 manufactured by Sumitomo 3M Co., Ltd. (perfluoroalkylalkoxylate). These fluorine compounds may be used optionally in a mixture of two or more, and a mixture of a compound having a boiling point of from 100° C. to 200° C. under 1 atmospheric pressure and a compound having a boiling point of at least 200° C. under 1 atmospheric pressure provides a satisfactory result.

Also, it is preferable to use these fluoroalkyl alcohols in combination with the compounds of the above formula (I) and/or (II).

Among the above-mentioned water-soluble liquid fluorine compounds (B), preferable examples include a fluorine compound of the above formula (I) and/or Krytox® 157 FSL, Krytox®157 FSM, and the like.

The water-soluble solid fluorine compound (A) and the water-soluble liquid fluorine compound (B), used in the present invention are the compounds that the hydrogen atoms of the compounds are substituted with fluorine atoms, and the fluorine substitution rate is preferably higher and it is usually preferable that at least 50% of hydrogen atoms are substituted with fluorine atoms.

The solid water-soluble solid fluorine compound (A)/the liquid water-soluble liquid fluorine compound (B) are used in a mixing weight ratio of from 10/1 to 1/20, preferably from 5/1 to 1/10.

The anti-reflective coating composition of the present invention contains these water-soluble fluorine compounds (A) and (B) in a total weight amount of from 1 to 10 wt % to an aqueous solvent.

Also, the anti-reflective coating composition of the present invention may further contain a film-formable polymer such as polyvinyl alcohol, polyacrylic acid, polyvinyl pyrrolidone and polyvinyl methyl ether. But its amount should be at most 20 wt %, preferably at most 10 wt %, to the total amount of fluorine compounds so as not to adversely affect on the refractive index. If the amount of the film-formable polymer is too high, a satisfactory refractive index can not be obtained.

It is general to use water as a solvent for the composition of the present invention, but in order to improve the solubility of the fluorine compound, organic solvents miscible with water, such as lower alcohols including methanol, ethanol or propanol, which may be substituted with a fluorine atom, or lower alkylcarboxylic acids including acetic acid, may be used in combination with water as a mixture solvent. In such a case, if the mixing ratio of an organic solvent is too high, the organic solvent tends to solve the lower photoresist layer when coating, and therefore the organic solvent is used preferably in an amount of at most 30 wt %, more preferably at most 20 wt %.

The composition of the present invention may further contain other fluorine-containing compounds having a low refractive index without departing from the spirit of the present invention, but such a low refractive index compound should be soluble in the above solution and its amount added should be preferably at most 20% to the total weight of the fluorine-containing compounds used in the present invention. Also, the composition of the present invention may still further contain a surfactant or the like in order to improve coating property, anti-foamability and the like.

From a lithographic viewpoint, it is preferable to add a compound having a function of reducing a light-absorbance of a projected light wavelength.

The pattern formation method according to the present invention is characterized in that the composition according to the present invention is coated on the photoresist film before exposure, in the known pattern formation method comprising the steps of coating a photoresist composition on a substrate, exposing the obtained photoresist film to form a specific pattern and developing the said photoresist with an aqueous alkaline solution.

As the photoresist composition used in the present invention, either positive type or negative type may be used, and various known photoresist compositions may be used. As positive type photoresist compositions, there may be mentioned naphthoquinone diazide type positive photoresist compositions usually comprising alkali-soluble resins, naphthoquinonediazide type photosensitizers and a solvent. (For example, see Japan Laid-Open Specification Sho 61-118744.)

As chemical amplification type positive photoresists, there are mentioned for example combinations of a polymer wherein hydroxyl group of polyhydroxystyrene is protected by t-butoxy carbonyl group and a photo-acid-generating material (see H. Ito, C. G. Willson: Polym. Eng. Sci., 23, 1012 (1983)) etc.

As chemical amplification type negative photoresists among the negative type photoresist compositions, there are mentioned photoresist compositions comprising alkali-soluble resins, hexamethoxymelamine as a crosslinking agent and photo-acid-generating material. (For example, see W. E. Feely, J. C. Imhof, C. M. Stein, T. A. Fisher, M. W. Legenza: Polym. Eng. Sci., 26, 1101 (1986)).

The substrates used in the pattern formation method according to the present invention are not particularly limited, and substrates for IC manufacturing such as silicone substrates and galium-arsenide substrates are generally used.

The method to coat the photoresist composition on the substrate is carried out in any usual way, for example, using a spin-coater etc.

Film thickness of the obtained photoresist is usually about 0.3–5.0 μm.

Heat-and-dry treatment after coating the photoresist on the substrate is carried out with a hot plate etc. usually at 70°–100° C. for 30–120 seconds.

The pattern formation method according to the present invention is characterized in that the above-mentioned composition is coated on the photoresist to form the anti-reflective coating on resist.

Film thickness of the anti-reflective coating may be optimized appropriately according to exposing wavelength etc.

Since the composition comprising the aqueous solution of the water soluble fluorine compound is used as the composition to form the anti-reflective coating, the formed anti-reflective coating can be easily removed after exposure with an aqueous alkaline solution during development or simply by rinsing with water. Further, since such anti-reflective coating is formed on the photoresist, change in resist pattern dimension and resolution are improved.

Although the coated film formed on the photoresist film comprising water soluble fluorine compound can be removed by an aqueous alkali developer during development after exposure, it is preferable to remove it previously by rinsing with water before development.

As the exposing wavelengths used in carrying out image transfer against the photoresist film formed on the substrate, there are generally mentioned g-line (436 nm), i-line (365 nm), Xe-Cl excimer laser radiation (308 nm), Kr-F excimer laser radiation (248 nm) or Ar-F excimer laser radiation (193 nm), but additionally multi-wavelengths may be used.

After exposure of the photoresist film and the anti-reflective coating, post-exposure-baking (PEB) may be carried out if required. PEB is preferably carried out using a hot plate etc., at 90°–120° C. and for 60–120 seconds. A convection oven may be substituted for the hot plate, and in this case it takes usually longer time than the case using the hot plate.

As aqueous alkaline solutions to develop the photoresist after exposure, aqueous solutions of inorganic alkalis such as sodium hydroxide, potassium hydroxide, sodium carbonate, ammonia, sodium silicate, sodium metasilicate etc., primary amines such as ethylamine and n-propylamine etc., secondary amines such as diethylamine and di-n-propylamine, tertiary amines such as triethylamine and methyldiethylamine etc., and quaternary ammonium salts such as tetramethylammonium hydroxide and trimethylhydroxyethylammonium hydroxide etc., themselves or mixed with alcohol etc. may be used.

Further, a surfactant etc. may be added and used, if required. It is desirable that development time is about 0–180 seconds and development temperature is about 15°–30° C. Photoresist developer may be used after filtration for removing insolubles.

Now, the present invention will be described in further detail with reference to Examples. However, it should be understood that the present invention is by no means restricted to such specific Examples.

Preparation of Anti-reflective Coating Composition

PREPARATION EXAMPLE 1

A salt of heptadecafluorooctanesulfonic acid (perfluorooctanesulfonic acid) neutralized with a tetramethylammonium hydroxide aqueous solution (neutralization rate: 95%) and 3-(2-tridecafluorohexyl)ethoxy-1,2-dihydroxypropane (having a viscosity of at least 100 centipoises) were mixed in a weight ratio of 60:40, and the mixture was dissolved in water in an amount of 4 wt % (non-solvent component concentration), and the resultant solution was filtrated through a 0.2 μm filter to obtain an anti-reflective coating composition (A).

PREPARATION EXAMPLE 2

An anti-reflective coating composition (B) was prepared in the same manner as in Preparation Example 1, except that the mixing ratio was changed to 65:35 and also that a mixture solvent having 2,2,3,3,4,4,5,5-octafluoropentanol added in an amount of 1 wt % to water was used.

PREPARATION EXAMPLE 3

An anti-reflective coating composition (C) was prepared in the same manner as in Preparation Example 1, except that heptadecafluorooctanesulfonic acid was replaced by pentadecafluorooctanoic acid (perfluorooctanoic acid).

PREPARATION EXAMPLE 4

An anti-reflective coating composition (D) was prepared, by mixing a salt of pentadecafluorooctanoic acid neutralized with a tetramethylammonium hydroxide aqueous solution (neutralization rate: 95%), and a salt of perfluoroalkylpolyethercarboxylic acid (Krytox® 157 FSL (viscosity: 28 centipoises, weight average molecular weight: about 2,500) manufactured by Du Pont Co., Ltd.) neutralized with a tetramethylammonium hydroxide aqueous solution (neutralization rate: 100%) in a weight ratio of 50:50, dissolving the mixture in a solvent of isopropyl alcohol/water (20/80 weight ratio) in an amount of 4 wt % (non-solvent component concentration), and filtrating the resultant solution through a 0.2 μm filter.

PREPARATION EXAMPLE 5

An anti-reflective coating composition (E) was prepared by mixing a salt of heptadecafluorooctanesulfonic acid neutralized with a tetramethylammonium hydroxide aqueous solution (neutralization rate: 95%), a salt of perfluoroalkylpolyethercarboxylic acid (Krytox® 157 FSL manufactured by Du Pont) neutralized with a tetramethylammonium hydroxide aqueous solution (neutralization rate: 95%), and polyvinyl pyrrolidone (Luviskol® K30 manufactured by BASF) in a weight ratio of 45:50:5, dissolving the mixture in a solvent of isopropyl alcohol/water (20/80 weight ratio) in an amount of 4 wt % (non-solvent component concentration) and filtrating the resultant solution through a 0.2 μm filter.

PREPARATION EXAMPLE 6

A comparative anti-reflective coating composition (F) was prepared in the same manner as in Preparation Example 1, except that 3-(2-tridecafluorohexyl)ethoxy-1,2-dihydroxylpropane was not used.

PREPARATION EXAMPLE 7

A comparative anti-reflective coating composition (G) was prepared in the same manner as in Preparation Example 1, except that the salt of heptadecafluorooctanesulfonic acid neutralized with tetramethylammonium hydroxide aqueous solution (neutralization rate: 95%) was not used.

PREPARATION EXAMPLE 8

A comparative anti-reflective coating composition (H) was prepared in the same manner as in Preparation Example 4, except that the salt of pentadecafluorooctanoic acid neutralized with tetramethylammonium hydroxide aqueous solution (neutralization rate: 95%) was not used.

PREPARATION EXAMPLE 9

A comparative anti-reflective coating composition (I) was prepared in the same manner as in Preparation Example 4, except that the salt of Krytox® 157 FSL neutralized with tetramethylammonium hydroxide aqueous solution (neutralization rate: 100%) was not used.

PREPARATION EXAMPLE 10

A comparative anti-reflective coating composition (J) was prepared in the same manner as in Preparation Example 1, except that 3-(2-tridecafluorohexyl)ethoxy-1,2-dihydroxypropane was replaced by polyvinyl pyrrolidone (Luviskol® K90 manufactured by BASF).

PREPARATION EXAMPLE 11

A comparative anti-reflective coating composition (K) was prepared in the same manner as in Preparation Example 10, except that the mixing ratio was made 70:30.

PREPARATION EXAMPLE 12

An anti-reflective coating composition (L) was prepared in the same manner as in Preparation Example 10, except that the mixing ratio was made 80:20.

PREPARATION EXAMPLE 13

A comparative anti-reflective coating composition (M) was prepared in the same manner as in Preparation Example 11, except that the tetramethylammonium salt of heptadecafluorooctane sulfonic acid was replaced by an ammonium salt of pentadecafluorooctanoic acid and that the polyvinyl pyrrolidone was replaced by α-perfluorononenyl-ω-methoxypolyoxyethylene (Ftergent 250 manufactured by Neos Co., Ltd.).

PREPARATION EXAMPLE 14

A comparative anti-reflective coating composition (N) was prepared in the same manner as in Example 10, except that the tetramethylammonium salt of heptadecafluorooctanesulfonic acid was replaced by an ammonium salt of pentadecafluorooctanoic acid and that the polyvinyl pyrrolidone was replaced by polyacrylic acid.

EXAMPLES 1 TO 5 AND COMPARATIVE EXAMPLES 1 TO 9

Each of the above prepared anti-reflective coating compositions (A) to (N) was spin-coated on a 5 inch-silicon wafer, and the coated film was dried by subjecting to heat-baking at 80° C. for 90 seconds on a hot plate to obtain a coated film having a film thickness of about 400 Å. The coated film thus obtained was visually observed to evaluate the coating properties and its refractive index was measured. The results are shown in the following Table 1. The coated film thus obtained was dipped in water at 23° C., and peeling property by dissolving of the coated film was observed. As this result, the coated films of both Examples and Comparative Examples could be peeled by dissolving without causing any problem.

TABLE 1

| | Anti-reflective coating composition | Preparation of coating film | Refractive index |
|---|---|---|---|
| Example 1 | A | Good | 1.36 |
| Example 2 | B | Good | 1.33 |
| Example 3 | C | Good | 1.37 |
| Example 4 | D | Good | 1.34 |
| Example 5 | E | Good | 1.33 |
| Comparative Example 1 | F | A large amount of crystal-like particles were observed. | — |
| Comparative Example 2 | G | Severe striations were caused and a satisfactory coating was impossible. | — |
| Comparative Example 3 | H | The coating solution was repelled and it was hard to coat satisfactorily on the whole surface. | — |
| Comparative Example 4 | I | A large amount of crystal-like particles were observed. | — |
| Comparative Example 5 | J | Good | 1.44 |
| Comparative Example 6 | K | Good | 1.42 |
| Comparative Example 7 | L | A minor amount of granular particles were observed. | 1.40 |
| Comparative Example 8 | M | Good | 1.39 |
| Comparative Example 9 | N | Good | 1.42 |

EXAMPLE 6 AND COMPARATIVE EXAMPLES 10 TO 11

A quinonediazide positive type photoresist (TSMR-V90 manufactured by Tokyooka Kogyo) was spin coated on a 5 inch-silicon wafer, and the coated film was dried by subjecting to heat-baking on a hot plate at 90° C. for 90 seconds to obtain a photoresist coating film having a film thickness of 10350 Å. Further, each of the above prepared anti-reflective coating compositions (A), (M) and (N) was spin-coated on the photoresist film, and was dried by subjecting to heat-baking on a hot plate at 90° C. for 60 seconds to obtain a wafer coated with a photoresist film having an anti-reflective coating (thickness: 700 Å) thereon.

The wafer thus prepared was exposed to light through a mask having test patterns by g-ray stepper DSW-6700B manufactured by GCA Co., Ltd., and the wafer was subjected to post exposure baking on a hot plate at 120° C. for 90 seconds, followed by subjecting to paddle development using 2.38% tetramethylammonium hydroxide aqueous solution for 60 seconds.

The exposure amount was determined so as to provide a 1 μm line and space (1:1) pattern and the developed pattern was observed by a scanning electron microscope. The results are shown in the following Table 2.

TABLE 2

| | Anti-reflective coating composition | Developed offprint pattern of 10 μm square | Line and space pattern of 1 μm |
|---|---|---|---|
| Example 6 | A | Normal development providing no development residue | Development was satisfactorily made without providing residue and peeling. |
| Comparative Example 10 | M | Normal development providing no development residue | Many patterns were peeled from a silicon substrate. |
| Comparative Example 11 | N | Much development residue was observed. | Much development residue was observed. |

EXAMPLES 7 AND COMPARATIVE EXAMPLES 12 TO 13

A quinonediazide positive type photoresist (MCPR-i6600 manufactured by Mitsubishi Chemical Corporation) was coated on plural wafers in the same manner as in Example 6 to obtain wafers coated with a photoresist coating film having a thickness of 10,000 to 12,000 Å at intervals of about 100 Å.

Further, each of the above prepared anti-reflective coating compositions (A) and (K) was coated on the photoresist film in the same manner as in Example 6 to form an anti-reflective coating (thickness: 670 Å(A) and 640 Å each). The wafer having the anti-reflective coating and the wafer having no anti-reflective coating were respectively exposed to light through a mask having test patterns by i-ray stepper NSR1755i7A (manufactured by Nikon Co., Ltd.), and were subjected to post exposure baking on a hot plate at 120° C. for 90 seconds, followed by subjecting to paddle development for 60 seconds using a 2.38% tetramethylammonium hydroxide aqueous solution.

The developed line width of the mask pattern image of 0.7 μm exposed under the same exposure amount was measured by an electron microscope.

As this result, the variation in the developed line width caused due to the thickness variation of a photoresist coating film was largest in the case of the test sample having no anti-reflective coating composition, and was smallest in the case of the test sample having the anti-reflective coating composition (A).

In the case of the test sample having the anti-reflective coating composition (K), the variation in the developed line width was smaller than that of the test sample having no anti-reflective coating composition, but the variation in the developed line width was not satisfactory.

As mentioned above, the anti-reflective coating composition of the present invention provides a low refractive index and satisfactory coating properties, and is easily removable by a water solution without causing a residue problem.

What is claimed is:

1. A composition for an anti-reflective coating on resist, which comprises a water-soluble fluorine compound and water as the main components, wherein the water-soluble fluorine compound contains (A) a water-soluble fluorine compound that is solid at 20° C., 1 atmospheric pressure, and (B) a water-soluble fluorine compound that is liquid at 20° C., 1 atmospheric pressure and that has a boiling point of at least 100° C. under 1 atmospheric pressure.

2. The composition according to claim 1, wherein (A) the water-soluble fluorine compound that is solid at 20° C., 1 atmospheric pressure, is at least one member selected from the group consisting of a perfluoroalkylsulfonic acid, a perfluoroalkylcarboxylic acid, a perfluoroalkylpolyethersulfonic acid, a perfluoroalkylpolyethercarboxylic acid and their salts.

3. The composition according to claim 1, wherein (B) the water-soluble fluorine compound that is liquid at 20° C., 1 atmospheric pressure and that has a boiling point of at least 100° C. under 1 atmospheric pressure, is a compound having a viscosity of at least 3 centipoises (cPs) at 25° C.

4. The composition according to claim 1, wherein (B) the water-soluble fluorine compound that is liquid at 20° C., 1 atmospheric pressure and that has a boiling point of at least 100° C. under 1 atmospheric pressure, is a compound having the following formula (I):

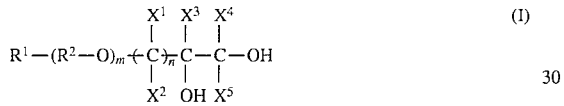

wherein $R^1$ is a fluorine-substituted alkyl group; $R^2$ is an alkylene group which may be substituted with fluorine; $X^1$, $X^2$, $X^3$, $X^4$ and $X^5$ are independently a hydrogen atom or a fluorine atom; and m and n are respectively an integer of from 0 to 5.

5. The composition according to claim 1, wherein (B) the water-soluble fluorine compound that is liquid at 20° C., 1 atmospheric pressure and that has a boiling point of at least 100° C. under 1 atmospheric pressure, is at least one member selected from the group consisting of a perfluoroalkylpolyethersulfonic acid, a perfluoroalkylpolyethercarboxylic acid and their salts.

6. The composition according to claim 5, wherein the perfluoroalkylpolyethercarboxylic acid has a weight average molecular weight of at most 6,000.

7. A pattern formation method comprising the steps of coating a photoresist composition on a substrate; coating on the obtained photoresist a composition for anti-reflective coating on resist; exposing the photoresist and the obtained anti-reflective coating on resist to form a specific pattern; and developing the photoresist with an aqueous alkaline solution, characterized in that a composition according to any of claim 1 to 6 is used as said composition for anti-reflective coating on resist.

* * * * *